(12) United States Patent
Middel et al.

(10) Patent No.: US 6,605,976 B2
(45) Date of Patent: Aug. 12, 2003

(54) HALF-BRIDGE CIRCUIT

(75) Inventors: Tjaco Middel, Nijmegen (NL); Stephanus Van Den Elshout, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/227,220

(22) Filed: Aug. 23, 2002

(65) Prior Publication Data

US 2003/0042967 A1 Mar. 6, 2003

(30) Foreign Application Priority Data

Aug. 28, 2001 (EP) ............................................ 01203249

(51) Int. Cl.[7] ................................................ H03K 17/56
(52) U.S. Cl. ........................................ 327/423; 327/424
(58) Field of Search ................................. 327/423, 424; 363/56.02, 56.05, 56.11, 95, 99, 123, 126, 127, 132, 133

(56) References Cited

U.S. PATENT DOCUMENTS

| | | | |
|---|---|---|---|
| 5,631,588 A | * | 5/1997 | Bertolini ...................... 327/108 |
| 5,886,563 A | * | 3/1999 | Nasila .......................... 327/423 |
| 6,504,316 B2 | * | 1/2003 | Ito et al. ...................... 315/224 |
| 6,538,279 B1 | * | 3/2003 | Blanchard ................... 257/328 |

* cited by examiner

Primary Examiner—Tuan T. Lam
(74) Attorney, Agent, or Firm—Aaron Waxler

(57) ABSTRACT

A half-bridge circuit including a low-side drive module (110) and a high-side drive module (210) for driving respective lower (T1) and upper (T2) transistors. Each drive module (110, 210) is a charge trap circuit in that the low-side drive module (110) drives the low-side transistor (T1) with the charge on a capacitive load (C), and the high-side drive module (210) alternately recharges the capacitive load (C) as it is driven by a high-voltage supply. Each charge trap circuit (110, 210) also includes a diode (D1, D2) that prevents unintentional loss of charge on a gate of a driven transistor (T1, T2), and a zener diode (Z1, Z2) that clamps the gate voltage at a safe level. In this manner, the half-bridge circuit is efficiently driven without the need of an auxiliary power supply.

10 Claims, 2 Drawing Sheets

HALF-BRIDGE CIRCUIT

FIELD OF THE INVENTION

The present invention relates generally to control circuitry, and more particularly to a half-bridge circuit.

BACKGROUND OF THE INVENTION

Bridge circuits are known in the art, and typically serve to convert a direct voltage into a high-frequency alternating voltage. Applications for high voltage half-bridge circuits include electronic ballasts for gas discharge lamps, switched mode power supplies, motor drives, DC-AC converters, and plasma display panel (PDP) drivers. In principle, a bridge circuit is composed of two switches which are connected in series between a high and a low supply voltage and are operated in push-pull to connect an output terminal alternately to the high and the low supply voltage. Where there is only one branch of switches, the circuit is a half-bridge circuit. With a half-bridge circuit half of the supply voltage is available for a resistive/inductive load, or the full supply voltage is available the load is capacitive, as in PDP display drivers. In a typical half-bridge circuit, the switches are field-effect transformers (FETs), such as n-type channel MOS transistors. The source of the low-side transistor and the drain of the high-side transistor are connected to the negative and the positive direct voltage supply, respectively. The drain of the low-side transistor and the source of the high-side transistor are both connected to an output terminal. The source of an inverter, also an n-type channel MOS transistor, is connected to the negative supply.

When a positive control signal is applied to the gate of the inverter transistor, the inverter transistor becomes conducting, the gate of the low-side transistor is connected to the low direct voltage (ground), and the low-side transistor is non-conducting. The high-side transistor is being "driven" in that the positive control signal is applied to the gate of the high-side transistor, which then becomes conductive. The output terminal is at the low level. Alternatively, a low control signal can be supplied to the gate of the inverter transistor and to the high-side transistor so that these transistors are non-conducting. In this case, the low-side transistor is being driven.

In either case, the normal logic supply voltage is too low to efficiently drive transistors. For example the threshold voltage is 1.5V, and the typical transistor driver supplies a gate-source voltage Vgs=10V. As Vgs increases, the conductivity of the transistor can increase greatly.

The upper or high-side transistor can be triggered by referencing the high voltage supply. However, the potential between the source of the high-side transistor to the high voltage supply is subject to variations as the states of other transistors in the circuit change. Existing circuit configurations compensate for these variations by employing a bootstrap circuit consisting of a diode, a capacitor, a resistor, and a 15V auxiliary voltage supply. The bootstrap circuit is established between the output terminal and the gate of the high-side transistor, thereby raising the potential almost 15V above the supply voltage. The bootstrap circuit also enables a current flow through the inverter, and provides a time delay so that the high-side and low-side transistors cannot simultaneously conduct, as the upper transistor may be subject to spurious triggers due to transients at the output terminal.

In one approach, the auxiliary voltage is derived via a resistor from the high direct voltage. The problem with this approach is increased circuit temperature, which indicates an unacceptable level of power dissipation. In order to reduce the current and associated dissipation, an additional switch can be added.

In high-current power semiconductors, the auxiliary voltage is generated by providing a negative voltage to the high-side transistor. A disadvantage of this approach is that the addition of separate transformers or transformer coils for each output phase of the inverter is required.

SUMMARY OF THE INVENTION

There is a current need for an improved configuration of a half-bridge circuit that overcomes the limitations inherent in existing bootstrap circuits by reducing power dissipation without requiring the provision of an auxiliary voltage supply. To this end, the invention provides a half-bridge circuit as defined by any of the independent claims. The dependent claims define advantageous embodiments.

The bridge circuit of the present invention fulfills the need described above by providing a half-bridge driver where either the low-side transistor, the high-side transistor, or both are driven by a "charge trap" which eliminates the need for an additional medium voltage auxiliary supply and eliminates spurious triggering of the high-transistor, thereby restraining power dissipation. This driver is preferably a high voltage integrated circuit.

Briefly, a preferred embodiment of the present invention is a half-bridge circuit that includes an upper and a lower transistor, both of which are high-voltage double-diffused MOSFETs (HV DMOS). The upper transistor is connected at its source to an output terminal, and at its drain to a terminal or rail to which a high direct voltage has been applied. As an example, the lower transistor is n-type, and is connected at its source to a low voltage rail (essentially, to ground), and at its drain to the same output terminal. A capacitive load element is also connected from the output terminal to the low voltage rail. In the exemplary embodiment of this invention, a control circuit provides the control signal that drives the upper transistor, and a second control circuit provides the control signal that drives the lower transistor. This second control circuit is a charge trap, which includes a third field-effect transistor connected at its drain to the output terminal, and at its source to the anode of a diode. The cathode of the diode is connected to the gate of the lower transistor. The second control circuit also includes a fourth field-effect transistor connected at its drain to the gate of the lower transistor and at its source to the low voltage rail, paralleled with a zener diode connected at its anode to the low voltage rail. The zener diode limits the voltage applied to the gate of the lower transistor to a safe level.

Another embodiment of the present invention provides a charge trap control circuit for the upper transistor. The upper control circuit includes a fifth field-effect transistor connected at its drain to the gate of the upper transistor and at its source to the low voltage rail; a sixth field-effect transistor connected at its drain to the low voltage rail and at its source to the anode of a second diode; and a second voltage-limiting zener diode connected at its anode to the source of the upper transistor and at its cathode to the gate of the upper transistor.

An aspect of the present invention is that the upper and the lower charge trap control circuits may be used in tandem in one half-bridge circuit, or individually with other control circuits.

All of the transistors in the above-described embodiments of this invention are field-effect transistors (FET). However, it will be clear without further explanation from the following description that the invention can be used both in full bridge circuits and in half-bridge circuits, and with transistors with similar characteristics including other MOS-type transistors and bipolar transistors such as the insulated gate bipolar transistor (IGBT).

Additional objects, advantages and novel features of the invention will be set forth in part in the description which follows, and in part will become more apparent to those skilled in the art upon examination of the following, or may be learned by practice of the invention.

DESCRIPTION OF PREFERRED EMBODIMENTS

Figure 1:
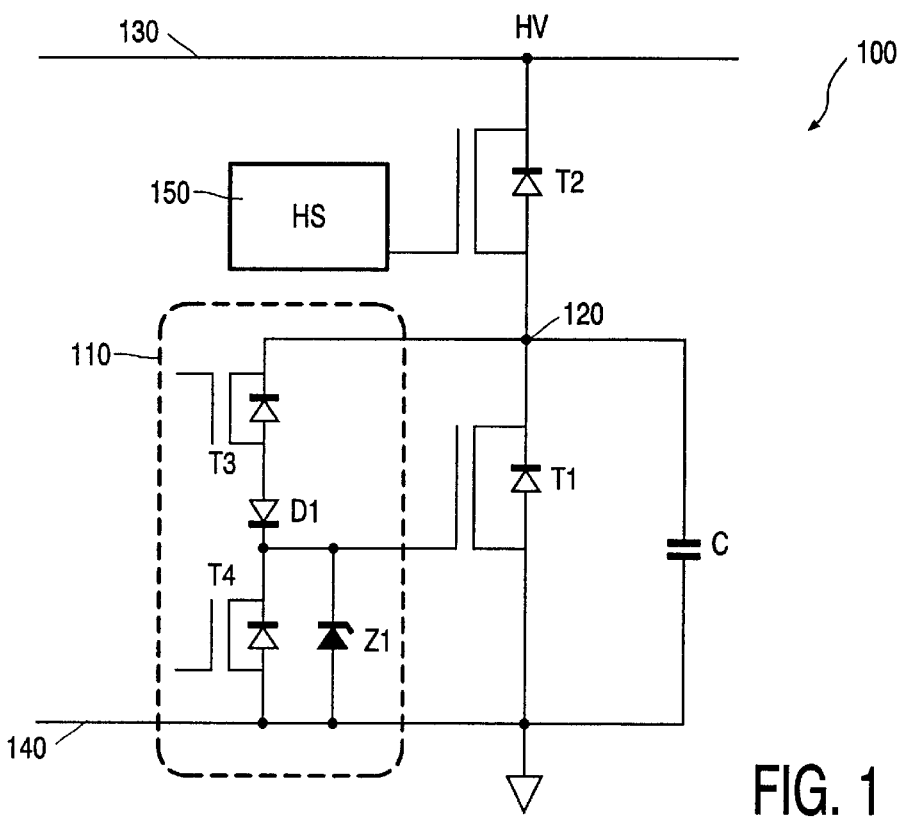
FIG. 1 is an electrical schematic diagram that shows a half-bridge circuit using the improved low-side drive of an exemplary embodiment of the present invention.

Referring now in detail to an exemplary embodiment of the present invention, which is illustrated in the accompanying drawings, in which like numerals designate like components, FIG. 1 is an electrical schematic diagram of a half-bridge circuit 100 employing an embodiment of the low-side charge trap 110 of the present invention. The low-side charge trap circuit 110 provides important features, such as the capacitive load C that provides the charge for triggering the low-side transistor T1, the zener diode Z1 for limiting the trigger voltage to a safe level, and the diode D1 for maintaining the trigger voltage on the gate of T1. Referring to FIG. 1, in the exemplary embodiment a low-side charge trap circuit 110 is a component of a half-bridge circuit 100. The half-bridge circuit 100 includes two switching transistors T1 and T2, an output terminal 120 and a high voltage supply HV. The high voltage supply HV supplies a high voltage at rail 130, while the rail 140 is at a relatively low potential. The lower or "low-side" field-effect transistor T1 is connected at its source to the low voltage rail 140, and at its drain to the output terminal 120. The high-side field-effect transistor T2 is connected at its drain to the high voltage supply HV, and at its source to the output terminal 120. As an example, both the high-side and low-side transistors T1 and T2 are high-voltage double-diffused MOSFETs (HV DMOS). The low-side charge trap circuit 110 includes a third field-effect transistor T3 connected in series with a diode D1 and with a fourth field-effect transistor T4 paralleled with a zener diode Z1. The third transistor T3 is connected at its drain to the output terminal 120 and at its source to the anode of the diode D1. In this exemplary embodiment, the third transistor T3 is a high voltage n-type channel double-diffused MOSFET (HV-nDMOS) type transistor. The cathode of the diode D1 is connected to the gate of the low-side transistor T1. The fourth transistor T4 is connected at its drain to the gate of the low-side transistor T1 and at its source to the low voltage rail 140. A charged capacitive load C is connected from the output terminal 120 to the low voltage rail 140.

Figure 2:
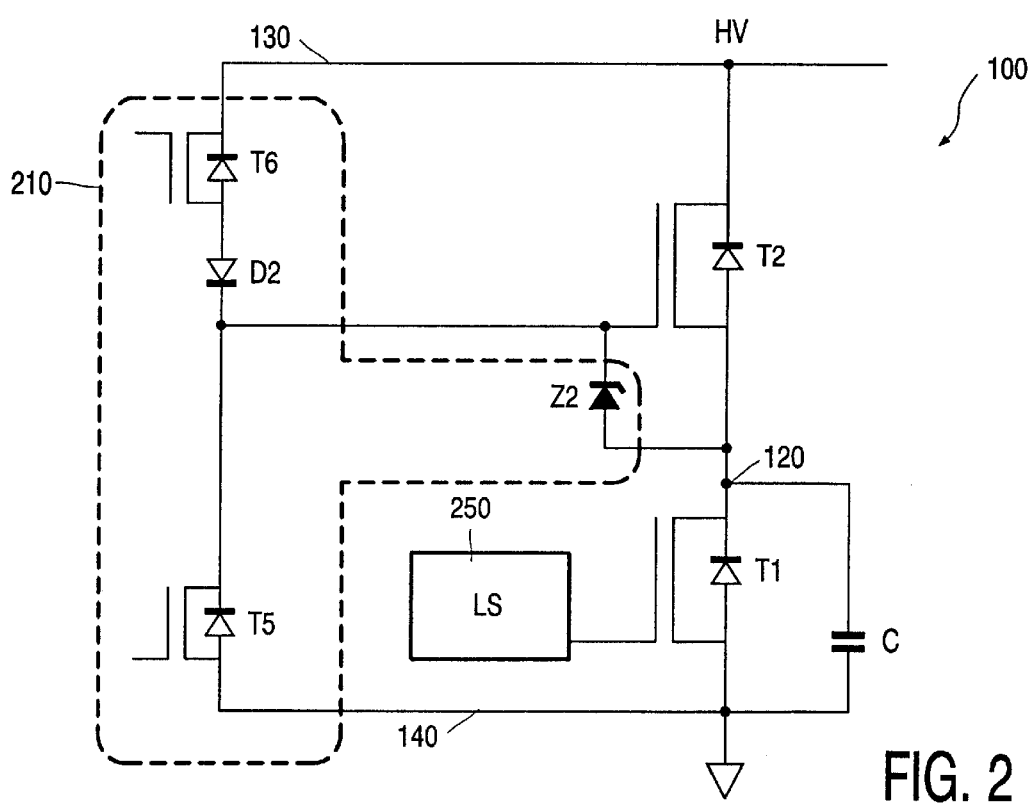
FIG. 2 is an electrical schematic diagram which shows a half-bridge circuit using the improved high-side drive of an exemplary embodiment of the present invention.

To operate, for example to convert direct-current (DC) to alternating-current (AC), the transistors T1 and T2 of a half-bridge circuit 100 must be alternately triggered. In the example of FIG. 1, the high-side transistor is triggered by a high-side drive 150, which may be configured as a high-side charge trap circuit 210 according to an alternative embodiment of the present invention, which is shown in FIG. 2 and described in detail below. The low-side charge trap 110 supplies the voltage required to trigger the low-side transistor T1.

In operation, to trigger T1 a signal S1 is applied to the gate of the third transistor T3. The gate of the low-side transistor T1 is then charged from the already charged capacitive load C through the third transistor T3 and the diode D1. Because the charge of the capacitive load C is now applied to the gate of the low-side transistor T1, the low-side transistor T1 is triggered and therefore begins to conduct. Connected in parallel with the fourth transistor T4, the zener diode Z1 limits the gate voltage of T1 to a safe value. By preventing discharge of gate voltage through the back-gate diode of the third transistor T3 from the low-side transistor T1, the diode D1 maintains the conducting state of the low-side transistor T1. When the capacitive load C is fully discharged, the voltage at the output terminal 120 is approximately 0V. The low-side transistor T1 is switched off by switching the third transistor T3 off, and the fourth transistor T4 on. The third transistor T3 and fourth transistor T4 are driven directly and indirectly by low voltage CMOS outputs (e.g., 3.3V or 5V), respectively.

Referring now to FIG. 2, an alternative exemplary embodiment of the present invention establishes a high-side charge trap circuit 210, which is shown as a component of a half-bridge circuit 100. The high-side charge trap circuit 210 includes a fifth field-effect transistor T5 connected at its source to the low voltage rail 140 and at its drain to the gate of the high-side transistor T2. The high-side charge trap circuit 210 also includes a sixth field-effect transistor T6 connected in series with a diode D2. Although other types of transistors with similar properties can be used, in this exemplary embodiment the sixth transistor T6 is a high voltage n-type channel double-diffused MOSFET (HV nDMOS) type transistor. The sixth transistor T6 is connected at its drain to the high voltage rail 130 and at its source to the anode of the diode D2. The cathode of the diode D2 is connected to the gate of the high-side transistor T2. A zener diode Z2 is connected at the output terminal 120 with the cathode of Z2 at the gate of the high-side transistor T2. An uncharged capacitive load C is connected from the output terminal 120 to the low voltage rail 140.

The operation of this alternative embodiment is very similar to that of the previous embodiment. The low-side transistor T2 is triggered by a low-side drive 250 that may be configured as a low-side charge trap circuit 110. To trigger the high-side transistor T2 a signal S2 is applied to the gate of the sixth transistor T6. The gate of the high-side transistor T2 is then charged from the high voltage supply HV through the sixth transistor T6 and the diode D2. The high-side transistor T2 is triggered and therefore begins to conduct, thereby recharging the uncharged capacitive load C. Connected across the source and gate of the high-side transistor T2, the zener diode Z2 limits the gate voltage of T2 to a safe value. By preventing discharge of gate voltage through the back-gate diode of the sixth transistor T6 from the high-side transistor T2, the diode D2 maintains the conducting state of the high-side transistor T2. Thus, the capacitive load C is fully charged such that the potential at the output terminal 120 is approximately equal to the voltage at the high voltage supply HV as measured at the high voltage rail 130. The high-side transistor T2 is switched off by switching the sixth transistor T6 off, and the fifth transistor T5 on. The fifth transistor T5 and sixth transistor T6 are driven directly and indirectly by low voltage CMOS outputs (e.g., 3.3V or 5V), respectively.

Figure 3:
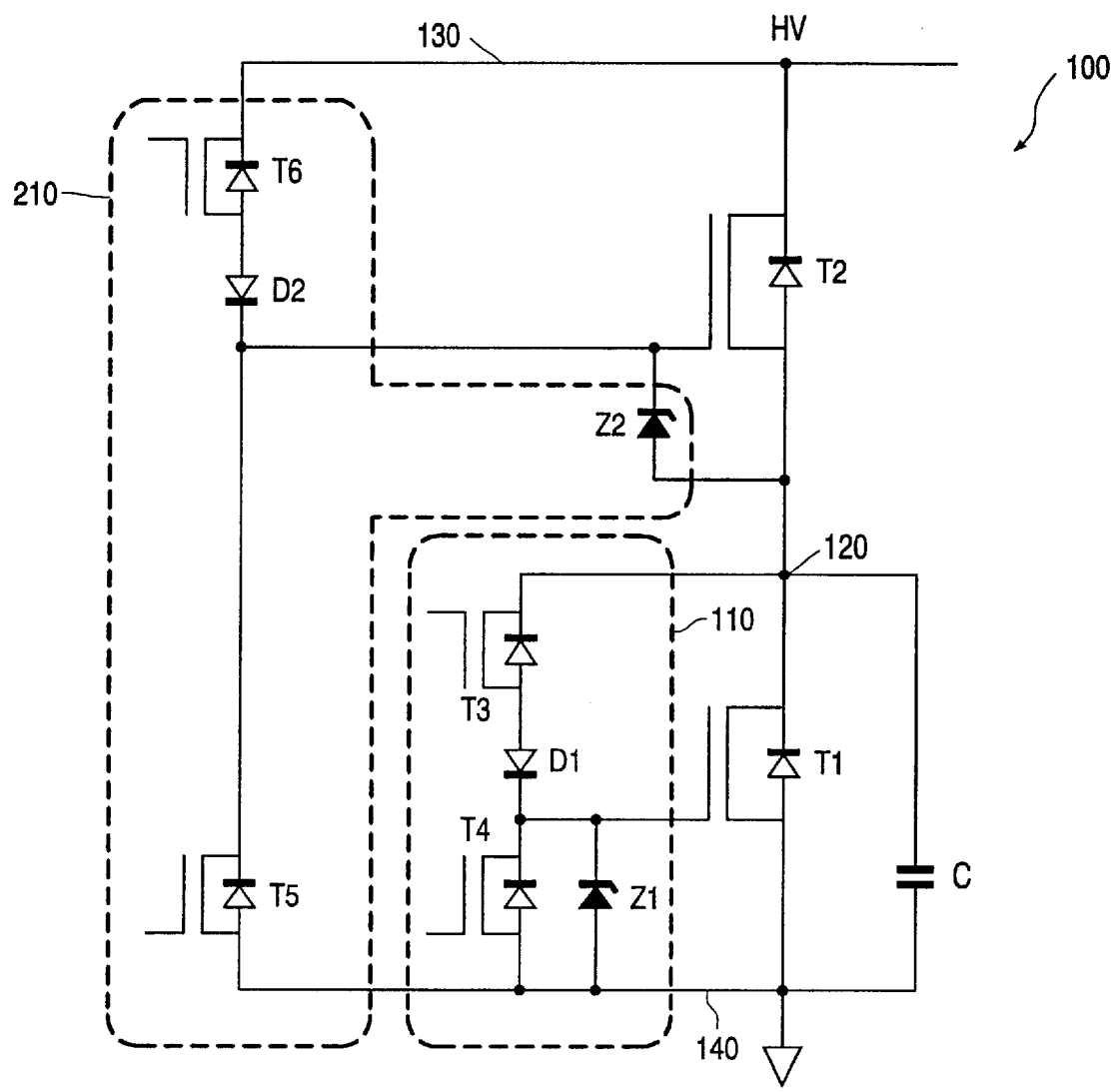
FIG. 3 is an electrical schematic diagram that shows a half-bridge circuit using the improved low-side in tandem with the improved high-side drive of an exemplary embodiment of the present invention.

Referring now to FIG. 3, in another embodiment both the low-side charge trap circuit 110 and the high-side charge trap circuit 210 are used to drive the low-side transistor T1 and the high-side transistor T2, respectively. According to FIG. 3, the components listed above with respect to FIGS. 1 and 2 are combined in that the high-side drive 150 is a high-side charge trap circuit 210, and the low-side drive 250 is a low-side charge trap circuit 110.

A preferred embodiment can thus be summarized as follows. A half-bridge circuit including a low-side drive module 110 and a high-side drive module 210 for driving respective lower T1 and upper T2 transistors. Each drive module 110, 210 is a charge trap circuit in that the low-side drive module 110 drives the low-side transistor T1 with the charge on a capacitive load C, and the high-side drive module 210 alternately recharges the capacitive load C as it is driven by a high-voltage supply. Each charge trap circuit 110, 210 also includes a diode D1, D2 that prevents unintentional loss of charge on a gate of a driven transistor T1, T2, and a zener diode Z1, Z2 that clamps the gate voltage at a safe level. In this manner, the half-bridge circuit is efficiently driven without the need of an auxiliary power supply.

In view of the foregoing, it will be appreciated that the present invention provides a circuit configuration for generating and maintaining a signal that is sufficient to trigger a transistor. Still, it should be understood that the foregoing relates only to the exemplary embodiments of the present invention, and that numerous changes may be made thereto without departing from the scope of the invention as defined by the following claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. A half-bridge circuit, comprising:
an upper transistor (T2) having a source connected to an output terminal (120), and a drain connected to a rail (130) for application of a high direct voltage;
a lower transistor (T1) having a source connected to a rail (140) for application of a low direct voltage, and a drain connected to the output terminal (120);
an upper transistor control circuit (HS) for driving the upper transistor (T2) by applying a signal to a control terminal of the upper transistor (T1); and
a lower transistor control circuit (110) for driving the lower transistor (T1) by applying a signal to a control terminal of the lower transistor (T1), the lower transistor control circuit (110) comprising:
a third transistor (T3) having a drain connected to the output terminal (120), and a source connected to an anode of a diode (D1), a cathode of the diode (D1) being connected to the control terminal of the lower transistor (T1); and
a fourth transistor (T4) having a drain connected to the control terminal of the lower transistor (T1), and a source connected to the rail (140) for application of a low direct voltage.

2. The half-bridge circuit of claim 1, wherein the lower transistor (T1) is a high-voltage double-diffused MOSFET (HV DMOS).

3. The half-bridge circuit of claim 1, wherein the third transistor (T3) is a high-voltage double-diffused n-channel MOSFET (HV nDMOS).

4. The half-bridge circuit of claim 1, wherein said lower transistor control circuit (110) further comprises a zener diode (Z1) having an anode connected at the rail (140) for application of a low direct voltage, and a cathode connected at the control terminal of the lower transistor (T1) for limiting the control terminal of the lower transistor (T1) to a safe voltage.

5. A half-bridge circuit, comprising:
an upper transistor (T2) having a source connected to an output terminal (120), and a drain connected to a rail (130) for application of a high direct voltage;
a lower transistor (T1) having a source connected to a rail (140) for application of a low direct voltage, and a drain connected to the output terminal (120);
a lower transistor control circuit (250) for driving the lower transistor (T1) by applying a signal to a control terminal of the lower transistor (T1); and
an upper transistor control circuit (210) for driving the upper transistor (T2) by applying a signal to a control terminal of the upper transistor (T2), the upper transistor control circuit (210) comprising:
a third transistor (T5) having a drain connected to the control terminal of the upper transistor (T2), and a source connected to the rail (140) for application of the low direct voltage; and
a fourth transistor (T6) having a drain connected to the rail (130) for application of the high direct voltage, and a source connected to an anode of a diode (D2), a cathode of the diode (D2) being connected to the control terminal of the upper transistor (T2).

6. The half-bridge circuit of claim 5, wherein the lower transistor (T1) is a high-voltage double-diffused MOSFET (HV DMOS).

7. The half-bridge circuit of claim 5, wherein the third transistor (T6) is a high-voltage double-diffused n-channel MOSFET (HV nDMOS).

8. The half-bridge circuit of claim 5, wherein said upper transistor control circuit (210) further comprises a zener diode (Z2) having an anode connected at the source of the upper transistor (T2), and a cathode connected at the control terminal of the upper transistor (T2) for limiting the control terminal of the upper transistor (T2) to a safe voltage.

9. A half-bridge circuit, comprising:
an upper transistor (T2) having a source connected to an output terminal (120), and a drain connected to a rail (130) for application of a high direct voltage;
a lower transistor (T1) having a source connected to a rail (140) for application of a low direct voltage, and a drain connected to the output terminal (120);
a lower transistor control circuit (110) for driving the lower transistor (T1) by applying a signal to a control terminal of the lower transistor (T1); and
an upper transistor control circuit (210) for driving the upper transistor (T2) by applying a signal to a control terminal of the upper transistor (T2);

wherein the lower transistor control circuit (110) comprises:
- a third transistor (T3) having a drain connected to the output terminal (120), and a source connected to an anode of a diode (D1), a cathode of the diode (D1) being connected to the control terminal of the lower transistor (T1); and
- a fourth transistor (T4) having a drain connected to the control terminal of the lower transistor (T1), and a source connected to the rail (140) for application of the low direct voltage; and wherein the upper transistor control circuit (210) comprises:
- a fifth transistor (T5) having a drain connected to the control terminal of the upper transistor (T2), and a source connected to the rail (140) for application of the low direct voltage; and
- a sixth transistor (T6) having a drain connected to the rail (130) for application of the high direct voltage, and a source connected to an anode of a second diode (D2), a cathode of the second diode (D2) being connected to the control terminal of the upper transistor (T2).

10. A composition, comprising:

the half-bridge circuit of claim 1; and a capacitive load (C) connected to the output terminal (120).

* * * * *